US008638896B2

(12) United States Patent
Liu et al.

(10) Patent No.: US 8,638,896 B2
(45) Date of Patent: Jan. 28, 2014

(54) REPEATE ARCHITECTURE WITH SINGLE CLOCK MULTIPLIER UNIT

(75) Inventors: Dean Liu, Sunnyvale, CA (US); Marc J. Loinaz, Palo Alto, CA (US); Stefanos Sidiropoulos, Palo Alto, CA (US)

(73) Assignee: Netlogic Microsystems, Inc., Irvine, CA (US)

( * ) Notice: Subject to any disclaimer, the term of this patent is extended or adjusted under 35 U.S.C. 154(b) by 532 days.

(21) Appl. No.: 12/728,129

(22) Filed: Mar. 19, 2010

(65) Prior Publication Data
US 2011/0228889 A1 Sep. 22, 2011

(51) Int. Cl.
*H04L 7/00* (2006.01)

(52) U.S. Cl.
USPC .......................................... 375/376; 375/374

(58) Field of Classification Search
USPC ......... 375/376, 359, 326, 327, 371, 374, 354; 327/156, 165, 166, 157
See application file for complete search history.

(56) References Cited

U.S. PATENT DOCUMENTS

| | | |
|---|---|---|
| 3,601,543 A | 8/1971 | Maniere et al. |
| 4,021,757 A | 5/1977 | Nossen |
| 4,110,558 A | 8/1978 | Kageyama et al. |
| 4,314,212 A | 2/1982 | Gradl |
| 4,507,629 A | 3/1985 | Frank |
| 4,586,010 A | 4/1986 | Linnenbrink |
| 4,621,242 A | 11/1986 | Theall et al. |
| 5,124,670 A | 6/1992 | Lawton |
| 5,471,162 A | 11/1995 | McEwan |
| 5,488,627 A | 1/1996 | Hardin et al. |
| 5,519,342 A | 5/1996 | McEwan |
| 5,559,474 A | 9/1996 | Matsumoto et al. |
| 5,712,882 A | 1/1998 | Miller |
| 5,774,084 A | 6/1998 | Brombaugh et al. |
| 5,864,250 A | 1/1999 | Deng |
| 5,936,445 A | 8/1999 | Babanezhad et al. ......... 327/157 |
| 6,122,336 A * | 9/2000 | Anderson ..................... 375/371 |
| 6,125,157 A | 9/2000 | Donnelly et al. |
| 6,167,467 A | 12/2000 | Itoh et al. |
| 6,198,415 B1 * | 3/2001 | Yoshikawa et al. ........... 341/100 |
| 6,226,332 B1 | 5/2001 | Agazzi et al. |
| 6,242,990 B1 | 6/2001 | Sokolov |
| 6,281,822 B1 | 8/2001 | Park |
| 6,285,726 B1 | 9/2001 | Gaudet |
| 6,292,061 B1 | 9/2001 | Qu ................................. 331/17 |
| 6,317,008 B1 | 11/2001 | Gabara |
| 6,397,042 B1 * | 5/2002 | Prentice et al. ............ 455/67.14 |

(Continued)

OTHER PUBLICATIONS

U.S. Appl. No. 10/176,495, filed Jun. 21, 2002, Sidiropoulos.

(Continued)

*Primary Examiner* — Shuwang Liu
*Assistant Examiner* — Helene Tayong
(74) *Attorney, Agent, or Firm* — Sterne, Kessler, Goldstein & Fox P.L.L.C.

(57) ABSTRACT

A circuit for clocking includes an input data path, a receiver, a set of flip-flops, at least one interpolator and a controller. The receiver is coupled to the input data path for receiving input data. The flip-flops, coupled to the receiver, sample the input data. A first interpolator, coupled to one or more of the flip-flops, receives the sampled input data. The controller, coupled to the first interpolator, controls the first interpolator by providing phase information regarding the input data to the first interpolator. The circuit reduces any jitter transferred from the input path to an output path.

20 Claims, 5 Drawing Sheets

(56) References Cited

U.S. PATENT DOCUMENTS

| | | | |
|---|---|---|---|
| 6,466,098 B2 | 10/2002 | Pickering | |
| 6,570,946 B1 | 5/2003 | Homol et al. | |
| 6,631,144 B1 | 10/2003 | Johansen | |
| 6,650,157 B2 | 11/2003 | Amick et al. | |
| 6,674,824 B1 | 1/2004 | Chiueh et al. | |
| 6,693,496 B1 | 2/2004 | Lebouleux | |
| 6,828,864 B2 | 12/2004 | Maxim et al. | |
| 6,901,126 B1* | 5/2005 | Gu | 375/355 |
| 6,927,611 B2 | 8/2005 | Rhee et al. | |
| 6,961,546 B1 | 11/2005 | Rofougaran et al. | |
| 6,967,513 B1 | 11/2005 | Balboni | |
| 6,999,543 B1 | 2/2006 | Trinh et al. | |
| 7,005,885 B1 | 2/2006 | Feldman | 326/16 |
| 7,054,404 B2 | 5/2006 | Saeki | |
| 7,078,946 B2 | 7/2006 | Van der Valk et al. | |
| 7,088,534 B2 | 8/2006 | Sutardja | |
| 7,089,444 B1 | 8/2006 | Asaduzzaman et al. | |
| 7,161,443 B2 | 1/2007 | Chen | |
| 7,162,002 B2 | 1/2007 | Chen et al. | |
| 7,183,959 B1 | 2/2007 | Dickey | |
| 7,227,476 B1 | 6/2007 | Wong | |
| 7,317,360 B2 | 1/2008 | Keaveney et al. | |
| 7,323,916 B1 | 1/2008 | Sidiropoulos et al. | 327/156 |
| 7,432,750 B1 | 10/2008 | Sidiropoulos et al. | 327/156 |
| 7,436,229 B2 | 10/2008 | Sidiropoulos et al. | 327/157 |
| 7,443,215 B1 | 10/2008 | Sidiropoulos | 327/156 |
| 7,532,697 B1 | 5/2009 | Sidiropoulos et al. | 375/376 |
| 7,595,670 B2* | 9/2009 | Hermann | 327/147 |
| 7,664,204 B1* | 2/2010 | Wang et al. | 375/326 |
| 7,679,345 B1 | 3/2010 | Verma et al. | |
| 7,839,758 B1 | 11/2010 | Gregorian et al. | 370/201 |
| 7,911,261 B1 | 3/2011 | Shamarao | 327/535 |
| 7,978,802 B1* | 7/2011 | Raha et al. | 375/371 |
| 8,074,126 B1* | 12/2011 | Qian et al. | 714/704 |
| 8,135,105 B2* | 3/2012 | Liu et al. | 375/376 |
| 2001/0043649 A1 | 11/2001 | Farjad-Rad | |
| 2002/0048318 A1 | 4/2002 | Zhang | |
| 2002/0070783 A1* | 6/2002 | Saeki | 327/235 |
| 2003/0081709 A1 | 5/2003 | Ngo | |
| 2003/0086501 A1 | 5/2003 | Dreps et al. | |
| 2003/0091139 A1 | 5/2003 | Cao | |
| 2003/0138008 A1 | 7/2003 | Riaziat et al. | |
| 2003/0161430 A1 | 8/2003 | Sou | |
| 2003/0182481 A1 | 9/2003 | Schoenborn | |
| 2004/0001600 A1* | 1/2004 | Kim et al. | 381/100 |
| 2004/0202266 A1 | 10/2004 | Gregorius et al. | |
| 2005/0040876 A1* | 2/2005 | Jeon | 327/291 |
| 2005/0111843 A1 | 5/2005 | Takeuchi et al. | |
| 2005/0180536 A1* | 8/2005 | Payne et al. | 375/354 |
| 2006/0023602 A1 | 2/2006 | Rauschmayers | |
| 2006/0029160 A1* | 2/2006 | Kim et al. | 375/326 |
| 2006/0145740 A1* | 7/2006 | Park et al. | 327/158 |
| 2007/0073943 A1* | 3/2007 | Saeki et al. | 710/71 |
| 2007/0153951 A1* | 7/2007 | Lim et al. | 375/376 |
| 2007/0297553 A1* | 12/2007 | Sutioso et al. | 375/373 |
| 2008/0049850 A1 | 2/2008 | Sidiropoulos et al. | 375/316 |
| 2008/0122546 A1* | 5/2008 | Shiramizu et al. | 331/34 |
| 2008/0260071 A1 | 10/2008 | Sidiropoulos et al. | 375/354 |
| 2009/0066423 A1* | 3/2009 | Sareen et al. | 331/19 |
| 2010/0090723 A1* | 4/2010 | Nedovic et al. | 327/3 |
| 2010/0091927 A1* | 4/2010 | Walker et al. | 375/374 |
| 2010/0164445 A1 | 7/2010 | Verma et al. | |
| 2010/0171527 A1* | 7/2010 | Maeda | 327/7 |
| 2011/0043253 A1* | 2/2011 | O'Keeffe et al. | 327/12 |
| 2012/0008701 A1* | 1/2012 | Buchwald et al. | 375/259 |

OTHER PUBLICATIONS

U.S. Appl. No. 12/185,750, filed Aug. 4, 2008, Sidiropoulos.
U.S. Appl. No. 11/930,978, filed Oct. 31, 2007, Sidiropoulos.
U.S. Appl. No. 12/185,750, filed Aug. 4, 2008, Stefanos Sidiropoulos.
U.S. Appl. No. 10/176,495, filed Jun. 21, 2002, Stefanos Sidiropoulos et al.
Sidiropoulos et al., Adaptive Bandwidth DLLs and PLLs using Regulated Supply CMOS Buffers, 2000 Symposium on VLSI Circuits Digest of Technical Papers.
Mansuri et al., A Low-Power Low-Jitter Adaptive-Bandwidth PLL and Clock Buffer, ISSCC 2003/Session 24/Clock Generation/Paper 24.5, ISSCC 2003/Feb. 12, 2003/Salon 8/ 3:45PM, 2003 IEEE International Solid-State Circuits Conference.
Mansuri et al. Jitter Optimization Based on Phase-Locked Loop Design Parameters, IEEE Journal of Solid-State Circuits, vol. 37, No. 11, Nov. 2002.
Maxim et al., A Low-Jitter 125-1250-MHz Process-Independent and Ripple-Poleless 0.18- μm CMOS PLL Based on a Sample-Reset Loop Filter, IEEE Journal of Solid-State Circuits, vol. 36, No. 11, Nov. 2001.
Maneatis, Self-Biased High-Bandwidth Low-Jitter 1-to-4096 Multiplier Clock Generator PLL, IEEE Journal of Solid-State Circuits, vol. 38, No. 11, Nov. 2003.
Sidiropoulos, A Semidigital Dual Delay-Locked Loop, IEEE Journal of Solid-State Circuits, vol. 32, No. 11, Nov. 1997.
U.S. Appl. No. 12/987,861, Jan. 10, 2011, Sidiropoulos et al.

* cited by examiner

REPEATE ARCHITECTURE WITH SINGLE CLOCK MULTIPLIER UNIT

FIELD

The present invention is related to the field of clocking, and is more specifically directed to a repeater architecture with a single clock multiplier unit.

BACKGROUND

Clock synthesis circuits are used to generate clock signals. Typically, the clock signals provide timing for operation of a circuit. In some applications, multiple timing references or clocks, which operate at different frequencies, are required. For example, some communication standards require operation of transmitter and receiver circuits at pre-determined clock frequencies. If a circuit supports multiple timing references, then multiple clock synthesis circuits are used. Typically, each clock synthesis circuit includes a timing reference, such as a crystal.

Some circuit applications require a variable frequency clock. In general, a variable frequency clock is a clock that changes frequency over time. One application to vary the clock frequency is spread spectrum clock generation. Some personal computers employ spread spectrum clock generation techniques to vary the clock frequency used for timing in an interface between a disk controller and a hard disk drive. The variable frequency for the timing clock helps reduce electromagnetic interference (EMI) that emanates from the personal computer.

For the spread spectrum clock application, clock synthesis circuits must generate a variable output frequency. Typically, to achieve this, the clock synthesis circuits use a traditional phase locked loop. The phase locked loop includes a feed-forward divider that divides the reference clock by a variable, M. The output of the divider is then fed into a phase locked loop that multiplies the signal by a variable, N. To obtain greater frequency resolution in such a circuit, the value of the divider and multiplier (e.g., the variables N and M) must be increased. This, in turn, reduces the phase locked loop update rate, and thus limits the phase locked loop bandwidth so as to make the loop more susceptible to power supply, substrate and inherent device noise.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION

In the following description, numerous details are set forth for purpose of explanation. However, one of ordinary skill in the art will realize that the invention may be practiced without the use of these specific details. In other instances, well-known structures and devices are shown in block diagram form in order not to obscure the description of the invention with unnecessary detail. A conventional transceiver architecture has two clock multiplier units (CMU), one for each of a transmitter and a receiver. The receiver clock multiplier unit or receiver phase locked loop tries to lock and/or recover the clock based on the incoming data stream such that the transmitter operates synchronously with the received data stream. The conventional architecture further includes an onboard reference clock. Preferably, the outgoing data stream locks onto the clock of the incoming data stream rather than the reference clock. Accordingly, the incoming data stream and the outgoing data stream preferably have the same frequency.

There are shortcomings associated with the conventional two CMU architecture implementation. For instance, the receiver clock multiplier unit uses a clean reference, while the transmitter clock multiplier unit uses a recovered clock as a reference. Hence, the recovered clock can undesirably degrade the transmitter performance. In a particular case, dithering degrades or causes jitter in the recovered clock, which thereby causes transmitter jitter. If there is jitter in the receive path, the jitter is undesirably transferred to the transmit path. There are additional disadvantages of using two clock multiplier units such as, for example, greater cost, greater power consumption, higher overheard, space and/or area requirements.

Figure 1:
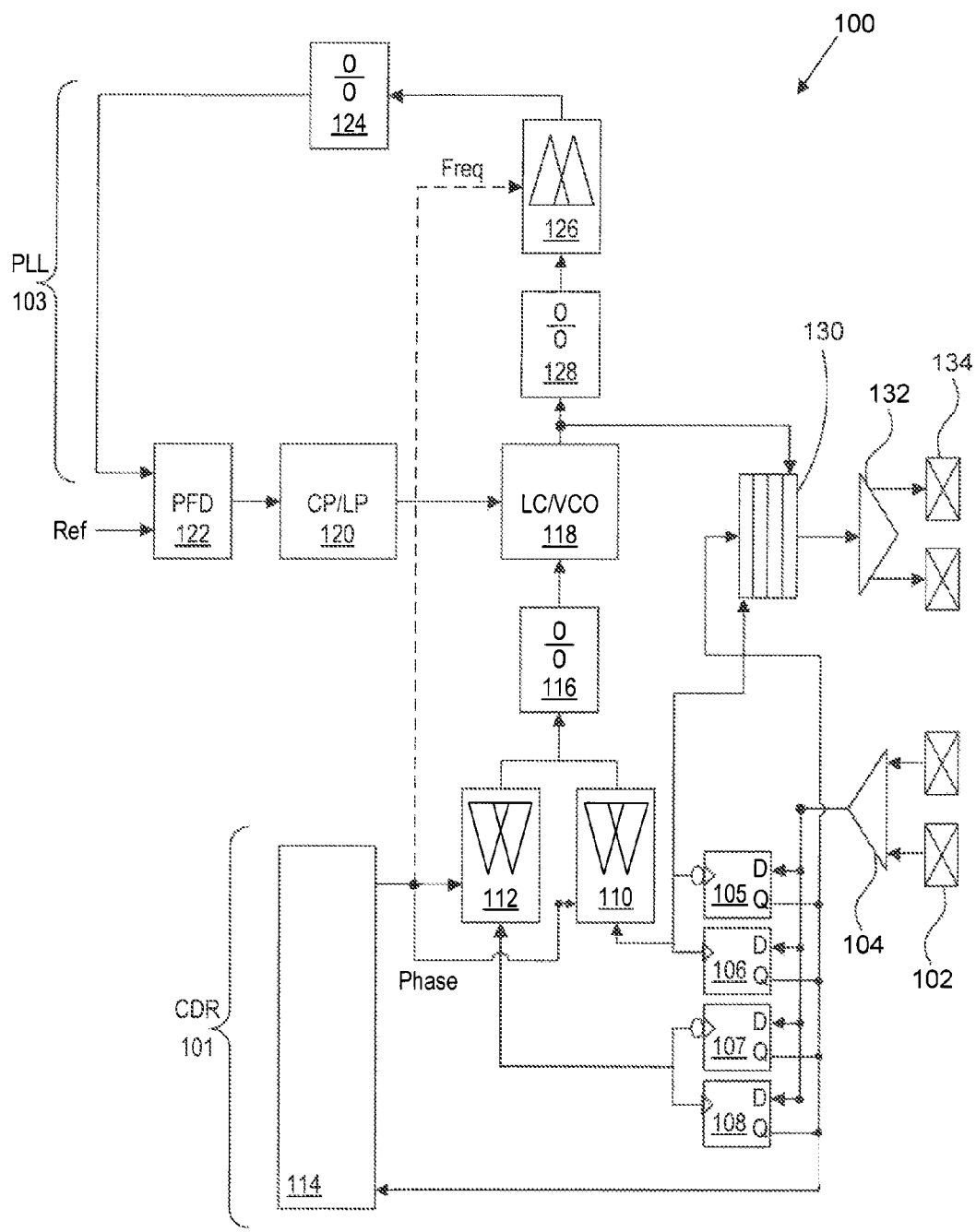
FIG. 1 illustrates a single and/or common clock-multiplier-unit architecture in accordance with some embodiments.

FIG. 1 illustrates a single and/or common clock multiplier unit (CMU) system architecture 100 according to some embodiments. As shown in FIG. 1, the system 100 includes an input data path 102, and an output data path 134. The input data path 102 is coupled to a receiver 104 that is coupled to several data slicers 105, 106, 107 and 108. In one embodiment, the data slicers 105-108 may be implemented by using D-type flip-flops that are coupled in pairs to phase interpolators 110 and 112. The phase interpolators 110 and 112 are also coupled to a control module 114 such as, for example, a finite state machine (FSM), and a divider 116. The control module 114, in one embodiment, comprises a second order finite state machine, and provides control signals to the phase interpolators 110 and 112. Such an embodiment is further described below in relation to FIG. 2.

The phase interpolators 110 and 112 are further coupled to a divider 116 that is coupled to a voltage controlled oscillator (VCO) 118 within a phase locked loop (PLL) 103. In one embodiment, the divider 116 divides by two. However, other division schemes may be implemented without deviating from the spirit or scope of the invention. Within the phase locked loop 103, the voltage-controlled oscillator 118 is coupled to a charge pump low pass (CP/LP) filter 120, which is coupled to a phase-and-frequency detector (PFD) 122. The phase-and-frequency detector 122 receives a reference signal and a feedback signal from a divider 124 in a feedback loop. In one embodiment, the divider 124 divides by 64 to match the implementation of the voltage controlled oscillator 118. Regardless of the particular implementation, the divider 124 couples the phase-frequency detector 122 to an interpolator 126. The interpolator 126 preferably receives a frequency control signal from the control module 114. The interpolator 126 is further coupled to a divider 128, which is coupled to the voltage controlled oscillator 118. The divider 128 and the voltage controlled oscillator 118 are both coupled to a first-in-first-out (FIFO) buffer 130. The FIFO buffer 130 receives input from data slicers 105 and 106, and outputs to a transmitter 132, which outputs to the output data path 134.

The single/common clock multiplier unit architecture 100 of a particular embodiment advantageously uses a digital control module 114, such as a digital finite state machine controller, to control the phase of the transmitter 132. With an interpolator 126 in the feedback loop, the system 100 recovers the timing, and generates the clock necessary for operation of the transmitter 132. The system 100 advantageously eliminates the need for additional/multiple clock multiplier units, and further reduces the amount of jitter transfer. More specifically, the system 100 embodiment reduces the amount of jitter in the transmitter transmits due to jitter in the receive path. In operation, data enters the input data path 102 and passes through the receiver 104. The data, generally serial data, is sliced and/or sampled in the sets of data slicers 105-106 and 107-108 prior to input to the phase interpolators 110 and 112. The phase interpolators 110 and 112 interpolate and/or generate a clock by using two clock phases having some phase separation. The phase of the generated clock is preferably between the phases of the two received clock phases. The control module 114 controls the resolution of the phase interpolation. The purpose of the control module 114 is to recover the clock and to control the phase of the transmitter 132.

As mentioned above, the top portions of FIG. 1 form a phase locked loop 103, with an interpolator 126 in the feedback path. The bottom portions of FIG. 1 form a clock-and-data recover (CDR) circuit 101. The purpose of the phase locked loop 103 is to generate the multiple clock phases for use by the clock-and-data recovery circuit 101. The control module 114 controls both the phase interpolator 126, the phase locked loop 103, and the interpolators 110 and 112 in the clock-and-data recovery circuit 101.

Within the system 100, the frequency of the incoming data and the frequency of the outgoing data are matched. The frequencies are matched in the nominal sense, but there may be instantaneous jitter in the incoming and outgoing data. The FIFO buffer 130 advantageously reduces instantaneous jitter. In some embodiment, only a shallow FIFO buffer 130 is required to reduce jitter.

The divider 116 changes the rate of operation of the system 100. Some embodiments more specifically use a divide-by-two divider 116 in the receiver to implement a half-rate architecture, where half rate operation is advantageous.

The following text describes the interpolator(s) 110, 112, and 126, of some embodiments in further detail. More specifically, the interpolator(s) 110, 112, and 126 may comprise an analog circuit capable of generating continuous phase delays. In another embodiment, the interpolator(s) comprise a digital circuit that varies the phase of an output signal or clock in discrete intervals. The disclosure herein sets forth digital circuit embodiments for the interpolator(s); however, the interpolator(s) may be implemented using analog circuits without deviating from the spirit or scope of the invention.

In one embodiment, the interpolator 126 comprises a phase interpolator that generates a feedback clock from two reference clocks (e.g., a clock with two different phases). The phase of the feedback clock is a weighted sum, based on an interpolator control word, of the phases of the two reference clocks. Implementing a phase interpolator is further described in an article entitled "A Semidigital Dual Delay-Locked Loop", IEEE Journal of Solid State Circuits, Vol. 32, No. 11, November 1997, authors Stefanos Sidiropoulos and Mark A. Horowitz. Additional information is also found in U.S. Pat. No. 7,432,750, filed Dec. 7, 2005, Ser. No. 11/296,786, entitled "Methods and Apparatus For Frequency Synthesis With Feedback Interpolation," which is hereby expressly incorporated by reference.

A time variable delay, introduced in the feedback path of the phase locked loop, generates an output clock with a variable frequency. In general, the phase of the output clock may be varied over time by changing the delay of the interpolator in discrete increments. Furthermore, the size of these increments may be varied over time. For the digital circuit embodiment, the feedback delay, introduced by the interpolator 126, is controlled by an interpolator control word. In one embodiment, the interpolator control word is a digital word comprising "n" bits. As shown in FIG. 1 and further described below in relation to FIG. 2, an interpolator control module 114 and/or 214 controls the phase delay in the interpolator 126, by generating the interpolator control word. The interpolator control module 114 and/or 214 modulates the value of the "n" bit interpolator control word. In turn, the "n" bit control word controls the phase delay in the interpolator(s). As a result, a desired frequency is generated at the output of the phase locked loop. Thus, by continuously incrementing or "slewing" the interpolator control word, the phase delay is also slewed over time so as to generate a variable output frequency.

Figure 2:
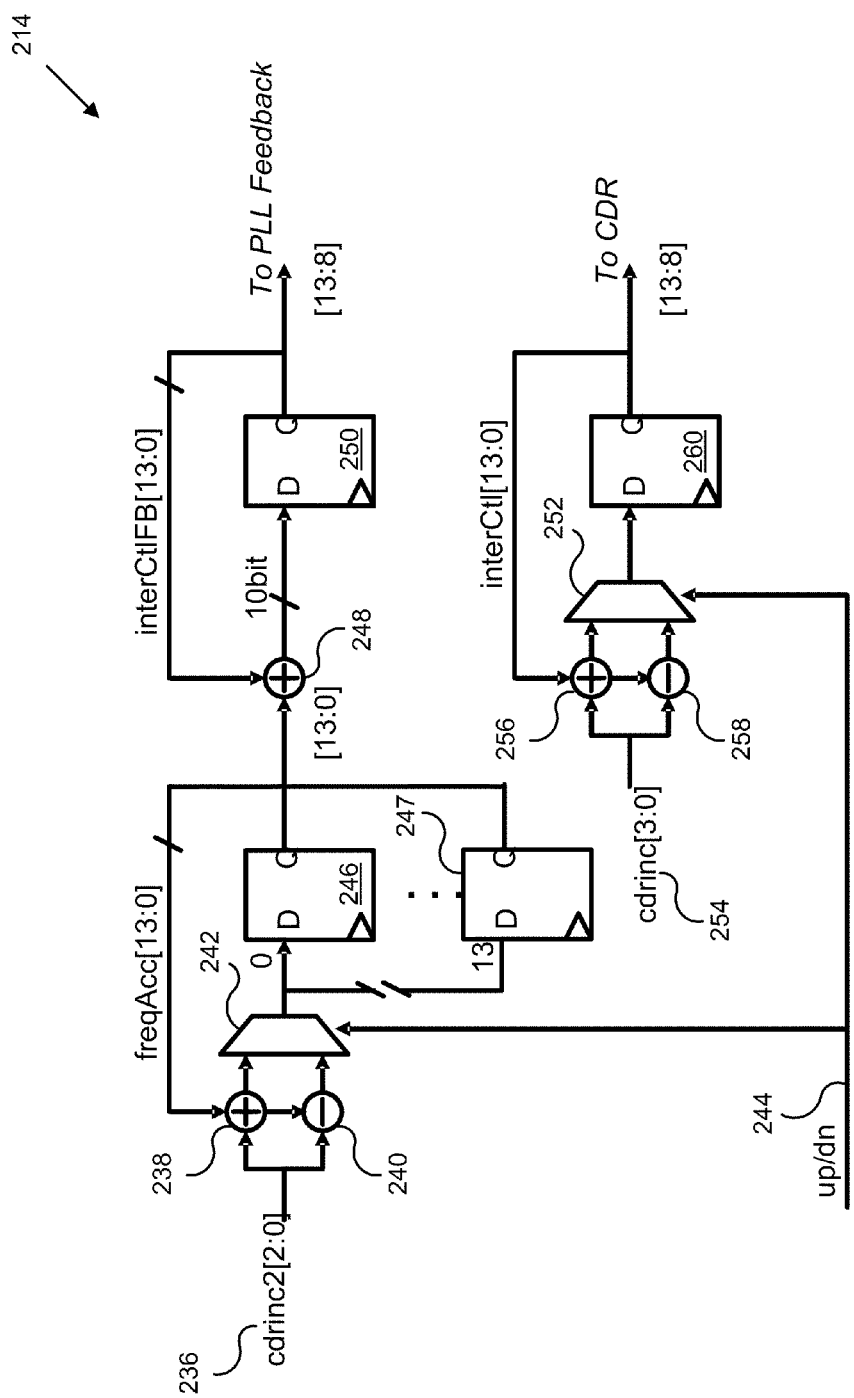
FIG. 2 illustrates a split dual loop control circuit of some embodiments.

FIG. 2 illustrates a control module and/or circuit 214 of some embodiments. As shown in FIG. 2, the control circuit 214 may be advantageously implemented by using a split dual-loop finite state machine (FSM). In the illustrated implementation 214, an input signal 236 is input to an adder 238 and a subtracter 240. As indicated, the input signal 236 is labeled "cdrinc2" and may have a three-bit format [2:0]. Other implementations, however, are also contemplated.

In this example, the adder 238 receives a fourteen bit accumulated value, labeled freqAcc [13:0], and outputs to subtracter 240 and multiplexer 242. The subtracter 240 also outputs to the multiplexer 242. An up/down ("up/dn") signal is generated based on the data stream using an Alexander algorithm. One implementation for an Alexander algorithm is disclosed in J. D. H. Alexander, "Clock Recovery from Random Binary Signals", Electron Lett., Vol. 11, No. 22, pp. 541-542, October, 1975. The multiplexer 242 receives select input from the up/down signal 244, and selects either the output of the adder 238 or the output of the subtracter 240. The multiplexer 242 outputs to 14 flip-flops (e.g., flip-flops 246-247) that implement saturating two's complement. The flip-flops 246-247 output signals to an adder 248, and also provides the accumulated value, freqAcc, that is fed back to the adder 238. The adder 248 receives an internal control feedback value, interCtlFB, and outputs a 10 bit value to flip-flops 250. The flip-flops 250 provide the feedback value, interCtlFB, and provide frequency information to the phase interpolator 126 in the feedback of the phase locked loop 103 of FIG. 1. Some control circuits 214 provide the information in the form of a control word.

The control circuit 214 also provides phase control information to the clock-and-data recovery circuit 101 of FIG. 1. A separate input signal 254 is input to an adder 256 and a subtracter 258. In the illustrated implementation, the input signal 254 comprises four bits, and is labeled "cdrinc [3:0]." The adder 256 receives an internal control value, interCtl [10:0], outputs to the subtracter 258, and outputs to a multiplexer 252. The subtracter 258 also outputs to the multiplexer 252, which receives a selection from the up/down signal 244. Based on the up/down select signal 244, the multiplexer selects either the output of the adder 256, or the output of the subtracter 258. The multiplexer 252 outputs a signal to a flip-flop 260, and the flip-flop 260 provides an internal control signal, interCtl, to the adder 256. The flip-flop 260 also provides phase information to the clock-and-data recovery circuit 101 of FIG. 1. Some embodiments provide the information in the form of a control word.

Hence, within circuit 214, the phase and frequency (control) information is split and/or divided into separate loops, and the controls based on each type of information have two separate outputs. Accordingly, the control circuit 214 has particular advantages for use with the single clock multiplier unit architecture 100 of FIG. 1. In the architecture 100, the interpolator 126 within the phase locked loop 103 of the top portion of FIG. 1 requires only frequency information, while the interpolators 110 and 112, within the clock-and-data recovery circuit 101 of the bottom portion of the FIG. 1, requires only phase information.

Accordingly the (second order) loop of the upper portion of FIG. 2 has an accumulator that accumulates the frequency, and the loop outputs and/or tracks the frequency information. The (first order) loop of the lower portion of FIG. 2 gives and/or tracks the phase information. Since the frequency used by the interpolator 126 has already been tracked by the (upper) second order loop, a simpler (first order) loop is used to track only the phase information.

In operation, the interpolator 126 adjusts the phase of the output of the voltage controlled oscillator 118. The interpolator 126 preferably adjusts the phase at a constant rate, which changes the frequency of the output of the voltage controlled oscillator 118. When the interpolator 126 advances the phase, it makes the operation of the voltage controlled oscillator 118 seem faster. When the interpolator 126 retards the phase, it makes the operation of the voltage controlled oscillator 118 seem slower.

As mentioned above, the interpolator 126 changes the phase at a constant rate, which changes the frequency of the output of the voltage controlled oscillator 118. Stated in relation to a digital implementation, the control code/word from the finite state machine 114 to the interpolator 126 requires constant updating. To change the phase at a constant rate, the control circuit 114 and/or 214 uses two integrators, and/or a cascade of summers, as described above in relation to FIG. 2. Advantageously, the loop having the accumulated frequency information, freqAcc, accumulates the error to obtain the frequency information. In these implementations, the error is the up and/or down difference between the clock of the incoming data and the clock of the voltage controlled oscillator 118.

Figure 3:
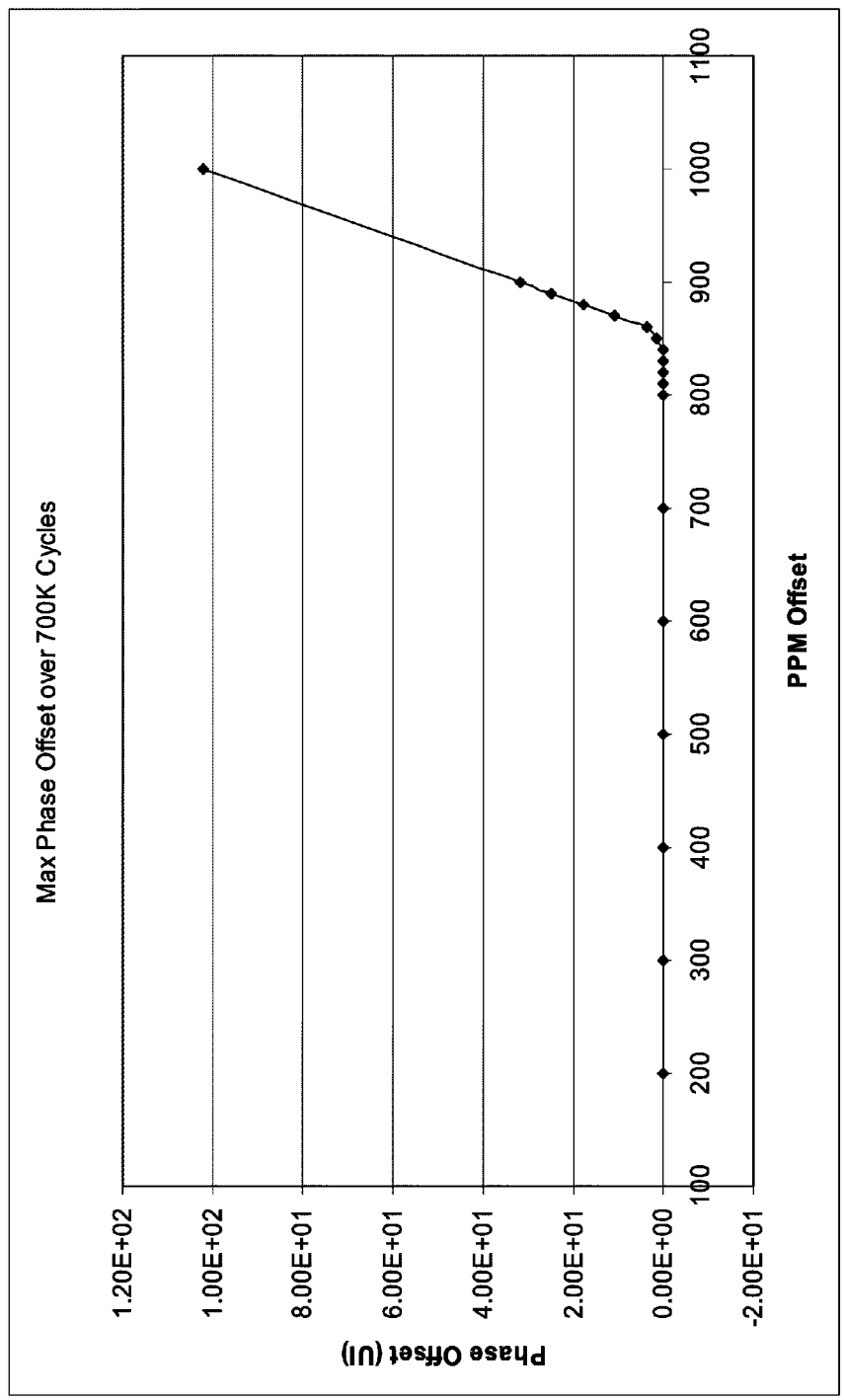
FIG. 3 illustrates tracking for a single/common clock-multiplier-unit architecture of some embodiments.

FIG. 3 is a plot 300 that illustrates the frequency offset tracking in parts per million (PPM) for a single/common clock multiplier unit architecture of some embodiments. The offset is between the reference clock and the incoming data stream. As shown in FIG. 3, the frequency loop accumulator illustrated in FIG. 2 tracks up to 840 PPM. The plot 300 shows that the system 100 and control module 114 and/or 214 tracks the frequency offset between the reference clock and the incoming data stream at approximately four times the maximum tracking of a conventional architecture that has a maximum tracking of about 200 PPM.

Figure 4:
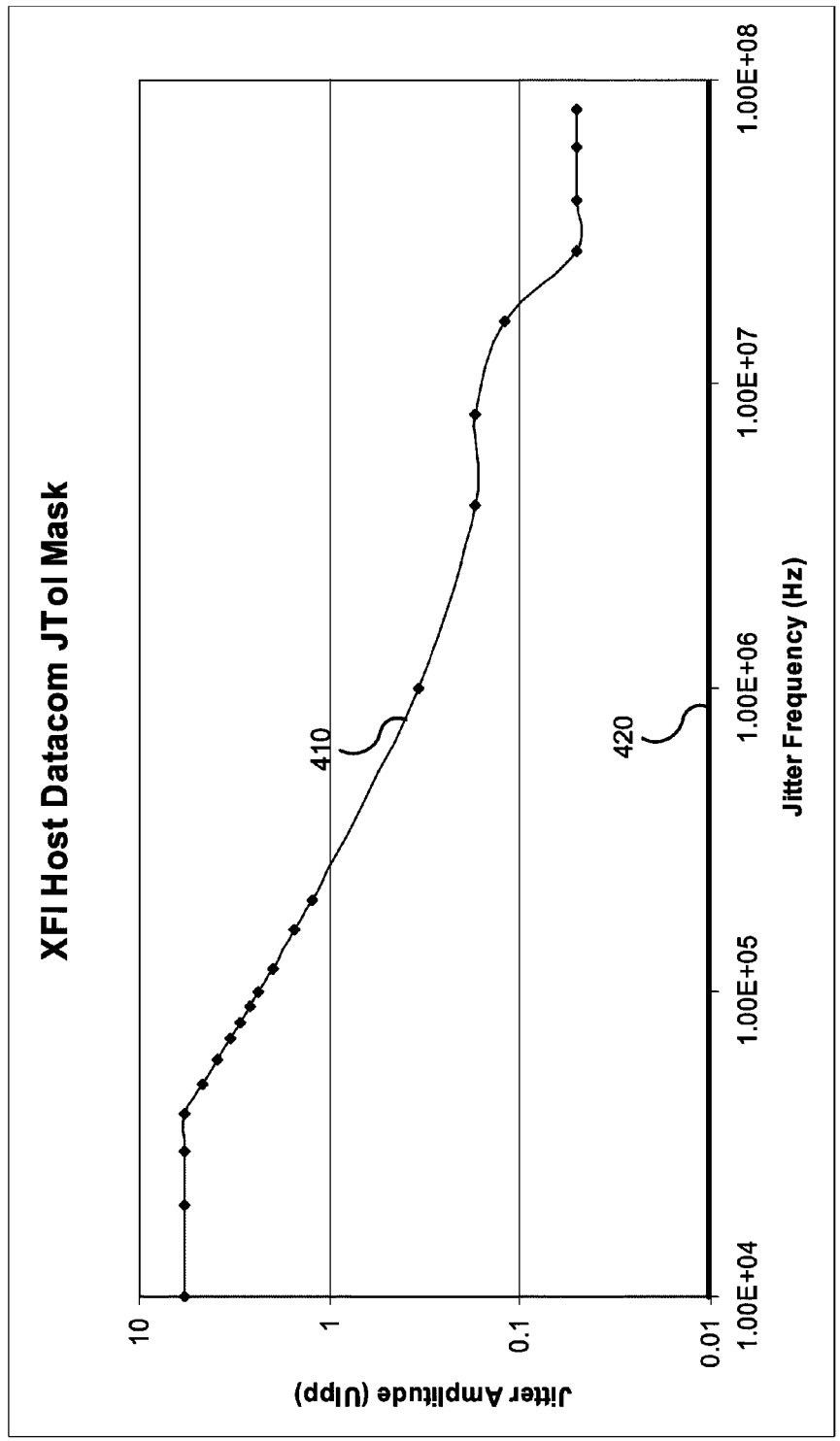
FIG. 4 illustrates a jitter transfer for example input jitter.

FIG. 4 is a plot 400 that illustrates an example of input jitter and corresponding output jitter in accordance with the present invention. Specifically, as shown in FIG. 4, the curve 410 shows an example of input jitter magnitude across a range of frequencies. The curve 420 illustrates zero jitter across the same frequency range. As such, FIG. 4 illustrates zero jitter transfer between the example input jitter and the resulting output jitter when using a JTol mask. Accordingly, as shown in FIG. 4, zero jitter is transferred when using the JTol mask as a test.

Figure 5:
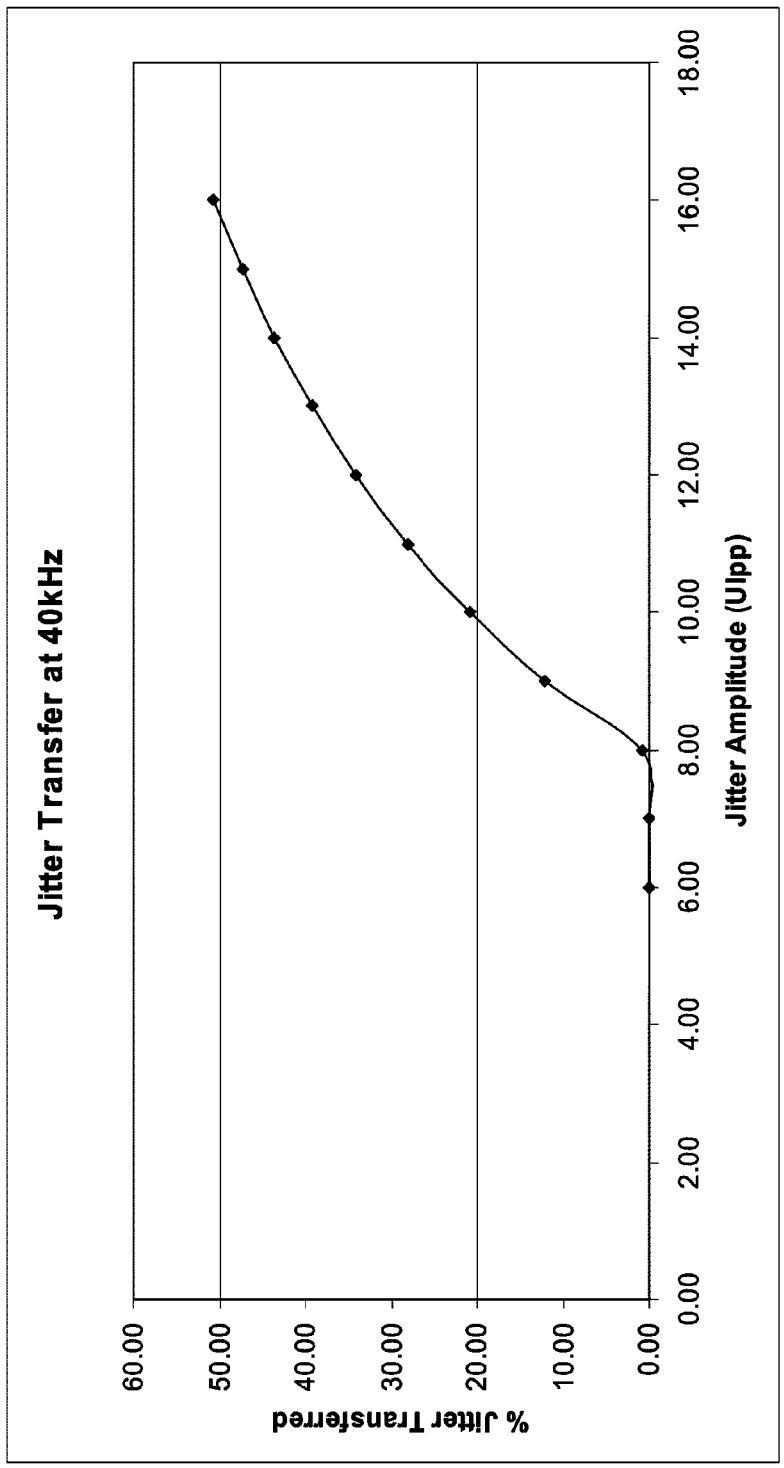
FIG. 5 illustrates jitter transfer at 40 kHz, according to some embodiments.

FIG. 5 is a plot 500 that illustrates jitter transfer for an example embodiment at 40 kHz according to some embodiments. As shown in FIG. 5, no jitter is transferred until the jitter amplitude reaches greater than 8.00 UI peak-to-peak. Moreover, the plot 500 shows that there is less than 50% jitter transfer for jitter amplitude between 8.00 and 16.00 UI peak-to-peak, and that there is only about 50% jitter transfer at a jitter amplitude of 18 UI peak-to-peak at 40 kHz. The amount of jitter transfer may be reduced by increasing the size of the accumulator (FIG. 1).

Advantages of Single/Common CMU Architecture:

Sharing a single and/or common clock multiplier unit reduces the power consumption of some embodiments by about ~40 mA. A further advantage is that there is low and/or reduced jitter transfer from the receive path to the transmit path of a transceiver using the single/common CMU system and appropriate control module such as described above.

In some implementations, however, a reference spur from the reference clock/signal may undesirably increase. For instance, in some of these implementations, the interpolator in the feedback of the phase locked loop pushes the voltage-controlled oscillator each compare cycle. Accordingly, a reference clock that has high jitter may undesirably transfer the jitter to the transmitter. Advantageously, some embodiments of the invention preferably include a loop filter to reduce the reference spur.

There are a number of clock-multiplier-unit loop-filter options. (1) One option is to add a third order ripple capacitor. The capacitor of these options is optimally sized to target the narrow frequency range of the reference clock. (2) Another option is to use a switched-capacitor architecture. Using a switched capacitor advantageously results in a significant reduction in the reference spur, but typically requires charge injection from the switches, which may undesirably limit performance. (3) A further option is to use a digital sigma-delta type loop filter. The sigma-delta type filter advantageously has the properties of the switched capacitor option, but without the need for charge injection. Some digital cascaded sigma-delta loop filter implementations also use error cancellation logic.

While the invention has been described with reference to numerous specific details, one of ordinary skill in the art will recognize that the invention can be embodied in other specific forms without departing from the spirit of the invention. Thus, one of ordinary skill in the art would understand that the invention is not to be limited by the foregoing illustrative details, but rather is to be defined by the appended claims.

The invention claimed is:

1. A system for clocking, the system comprising:
   a phase locked loop configured to provide a plurality of phases to a voltage controlled oscillator coupled to the phased locked loop;
   a first phase interpolator coupled to the voltage controlled oscillator within the phase locked loop, the first phase interpolator configured to receive frequency information and modify operation of the voltage controlled oscillator based on the frequency information; and
   a clock-and-data recovery circuit coupled to the phase locked loop, the clock-and-data recovery circuit configured to receive input data, obtain a phase of the input data, generate the frequency information, and provide the frequency information to the first phase interpolator.

2. The system of claim 1, further comprising a transmitter, coupled to the phase locked loop, configured to transmit data through an output data path.

3. The system of claim 1, further comprising a receiver, coupled to the clock-and-data recovery circuit, configured to receive data from an input data path.

4. The system of claim 1, further comprising a set of flip-flops configured to sample the input data.

5. The system of claim 1, further comprising a second phase interpolator configured to receive the input data from one or more flip-flops.

6. The system of claim 1, wherein the clock-and-data recovery circuit further comprises a controller coupled to the first phase interpolator and coupled to a second phase interpolator, the controller being configured to provide the frequency information to the first phase interpolator, and being configured to provide phase information to the second phase interpolator.

7. The system of claim 1, further comprising a second order, split dual loop finite state machine comprising a second order loop configured to obtain frequency information, and a first order loop configured to obtain phase information, the second order loop and the first order loop configured to receive an up/down signal that comprises a difference between a phase of the input data and a phase of the voltage controlled oscillator.

8. The system of claim 1, further comprising one or more of a phase-frequency detector, a low pass filter, and a divider.

9. The system of claim 1, wherein the system reduces jitter transferred from the input data of a receiver to outgoing data of a transmitter.

10. The system of claim 1, further comprising a first-in-first-out (FIFO) buffer coupled between the voltage controlled oscillator and a transmitter such that the FIFO buffer reduces instantaneous jitter for outgoing data.

11. A circuit for clocking, the circuit comprising:
an input data path configured to receive input data;
a receiver coupled to the input data path;
a set of flip-flops coupled to the receiver, the flip-flops configured to sample the input data;
at least a first interpolator coupled to one or more flip-flops, configured to receive the sampled input data;
a controller coupled to the first interpolator, configured to control the first interpolator by providing phase information regarding the input data to the first interpolator; and
a phase locked loop coupled to the first interpolator, the phase locked loop including a second interpolator and a voltage controlled oscillator, wherein the second interpolator is coupled to the controller and is configured to modify operation of the voltage controlled oscillator based on frequency information received from the controller.

12. The circuit of claim 11, further comprising a transmitter coupled to the phase locked loop.

13. The circuit of claim 11, wherein the controller comprises a finite state machine, wherein the circuit reduces jitter transfer from the receiver to a transmitter.

14. A method of clocking, the method comprising:
receiving input data from an input data path and obtaining, using a controller, at least one of frequency and phase information from the input data;
generating, using a first interpolator, a plurality of at least one of frequencies and phases for input to a voltage controlled oscillator coupled to a phase locked loop, the first interpolator using the at least one of frequency and phase information; and
modifying, using a second interpolator, operation of the voltage controlled oscillator based on the at least one of frequency and phase information of the received input data.

15. The method of claim 14, further comprising:
sampling the input data by using one or more flip-flops; and
providing the sampled input data to the first interpolator.

16. The method of claim 14, further comprising:
receiving an up/down signal that comprises a difference between a phase of the input data and a phase of the voltage controlled oscillator;
obtaining the phase information by using a phase accumulator loop; and
obtaining the frequency information by using a frequency accumulator loop.

17. The method of claim 14, further comprising one or more of:
providing a reference clock to the phase locked loop;
receiving the reference clock in a phase-frequency detector;
filtering by using a charge-pump filter,
dividing an output of the second interpolator to change a rate of operation of the voltage controlled oscillator; and
reconstructing a clock for the received input data.

18. The method of claim 14, further comprising:
buffering an output of the voltage controlled oscillator to a transmitter such that the buffering reduces instantaneous jitter for outgoing data.

19. The method of claim 14, further comprising:
transmitting data through an output data path, and reducing jitter transferred from the input data of a receiver to outgoing data of a transmitter.

20. The method of claim 14, further comprising obtaining the frequency and phase information from the input data, wherein the first interpolator is configured to generate the at least one of frequencies and phases for input to the voltage controlled oscillator based on the phase information; and wherein the second interpolator is configured to modify the operation of the voltage controlled oscillator based on the frequency information.

* * * * *

UNITED STATES PATENT AND TRADEMARK OFFICE
CERTIFICATE OF CORRECTION

| | | |
|---|---|---|
| PATENT NO. | : 8,638,896 B2 | Page 1 of 1 |
| APPLICATION NO. | : 12/728129 | |
| DATED | : January 28, 2014 | |
| INVENTOR(S) | : Liu et al. | |

It is certified that error appears in the above-identified patent and that said Letters Patent is hereby corrected as shown below:

On the Title Page, Item (54) and in the Specification, Column 1, Line 1, Title, please replace "REPEATE" with --REPEATER--.

Signed and Sealed this
Twenty-seventh Day of May, 2014

Michelle K. Lee
*Deputy Director of the United States Patent and Trademark Office*